United States Patent [19]

Ibuchi et al.

[11] Patent Number: 5,003,344
[45] Date of Patent: Mar. 26, 1991

[54] PROJECTION UNIT FOR A LIGHT PERMEABLE ORIGINAL IN A COPYING MACHINE

[75] Inventors: Yoshiaki Ibuchi; Mitsuru Ogura, both of Nara; Akira Tamagaki, Soraku; Shougo Iwai, Yamatokoriyama, all of Japan

[73] Assignee: Sharp Kabushiki Kaisha, Japan

[21] Appl. No.: 506,348

[22] Filed: Apr. 9, 1990

[30] Foreign Application Priority Data

| Apr. 12, 1989 | [JP] | Japan | 1-43536 |
| Apr. 12, 1989 | [JP] | Japan | 1-43537 |
| Apr. 12, 1989 | [JP] | Japan | 1-43538 |
| Apr. 12, 1989 | [JP] | Japan | 1-43539 |

[51] Int. Cl.$^5$ .................... G03B 27/48; G03B 27/50
[52] U.S. Cl. ............................... 355/50; 355/67
[58] Field of Search ..................... 355/50, 51, 67

[56] References Cited

U.S. PATENT DOCUMENTS

| 3,982,831 | 9/1976 | Kingsley | 355/51 |
| 4,015,902 | 4/1977 | Betensky | 355/50 |
| 4,374,618 | 2/1983 | Howard | 355/50 |
| 4,435,077 | 3/1984 | Suzuki et al. | 355/51 |
| 4,702,593 | 10/1987 | Detsch | 355/67 |
| 4,914,470 | 4/1990 | Giosue | 355/67 |

Primary Examiner—Monroe H. Hayes
Attorney, Agent, or Firm—Nixon & Vanderhye

[57] ABSTRACT

A projection unit, which is mounted in a copying machine and used to project an image of a light permeable original onto a prescribed exposure point on a photosensitive material, comprising a light source for exposure in a box, an original holding means which holds the original in a prescribed position with respect to the light source and the photosensitive material and is disposed movably in the box so that the image of the original is scanned in a prescribed direction with respect to the photosensitive material, a driving means for moving the original holding means in the scanning direction, a transmission means provided between the original holding means and the driving means which is capable of moving between an engaged position in that the transmission means is coupled to the original holding means and driving means so as to transmit power of the driving means to the holding means and a disengaged position in that the transmission means is not coupled to the original holding means and the driving means, and a switching means for putting the transmission means into the engaged position or disengaged position.

11 Claims, 9 Drawing Sheets

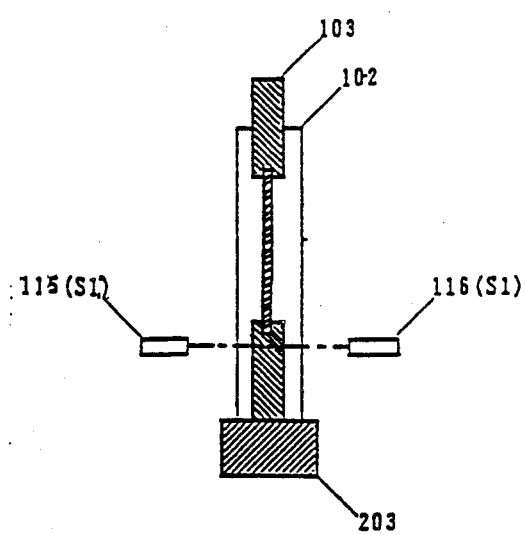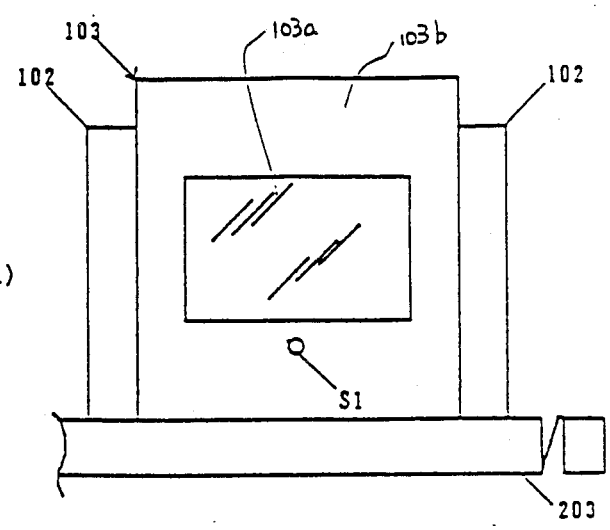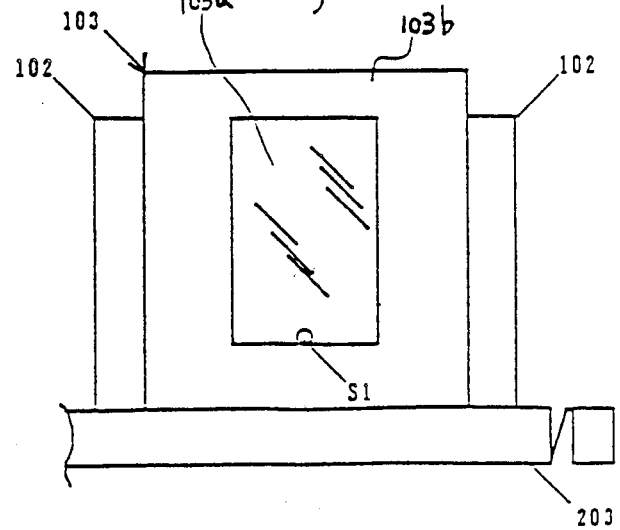

PROJECTION UNIT FOR A LIGHT PERMEABLE ORIGINAL IN A COPYING MACHINE

BACKGROUND OF THE INVENTION

1. Field of the invention

The present invention relates to a projection unit mounted in a copying machine which is used for projecting an image of a light permeable original such as a slidefilm, liquid crystal panel, electro-luminance (EL) panel or the like, onto a prescribed exposure point on a photosensitive material.

2. Description of the prior art

In recent years, there have been developed copying machines for copying an image of a document placed on a document table which are also capable of copying an image of a light permeable original such as a slidefilm, liquid crystal panel, EL panel or the like. Such copying machines are mounted with a projection unit which is used for projecting the image of the light permeable original onto a prescribed exposure point on a photosensitive material. In such copying machines, for copying the image of the document, an exposure optical system is used to project the image of the document onto the photosensitive material for slit exposure, and for copying the image of the light permeable original, the projection unit is used to project the original image onto the photosensitive material for slit exposure. By projecting the image of the original onto the same position on the photosensitive material as when projecting the image of the document, a copy image of the original can be produced by making use of the existing units of the copying machine in after-exposure processes.

When a slidefilm is used as an original for slit exposure by the projection unit, the slidefilm is scanned with light from a light source. The slidefilm usually consists of a small rectangular film measuring about 1 to 2 cm on one side and a mount for sandwiching the periphery of the film across the thickness thereof. The mount is supported on a slide holder which is moved at a given speed with respect to the light source and the photosensitive material. To move the slide holder at a given speed with respect to the light source, the slide holder is coupled to a driving source such as a motor via a transmission mechanism.

Illumination of the slidefilm mounted on the slide holder is usually performed in a light-shielded box in order to avoid effects of external light. To mount the slidefilm on the slide holder disposed inside the box, the box is provided with an opening through which the slidefilm is inserted for mounting on the slide holder. If the slide holder is not positioned near the opening through which the slidefilm is inserted, the slidefilm may not be securely held in the slide holder, but may drop into the box. It would not be easy to remove the slidefilm once it dropped into the box. It is therefore desirable that the slide holder is positioned near the opening so as to ensure firm holding of the slidefilm in the slide holder.

However, when the slide holder is coupled to a driving source via a transmission mechanism, the transmission mechanism and the driving source must also be moved to move the slide holder from the scanning position where the slidefilm is illuminated and scanned to the position near the opening through which the slidefilm is inserted. Moving the slide holder by hand will require a lot of force because the transmission mechanism and the driving source are also moved together with the slide holder. Furthermore, the construction of the slide holder itself must be sturdy enough to withstand the great force applied to it, which will lead to an increase in the size of the projection unit as well as in costs.

Usually, the slidefilm comprises the film which is covered on its periphery by the mount having a greater thickness than that of the film. The thickness of the mount does not always come to the same, but slightly varies from one slidefilm to another. With the slidefilm mount held in the slide holder, light is projected onto the film, and the light transmitted through the film is projected onto the exposure point on the photosensitive material. The slide holder is retained at a prescribed distance from the exposure point on the photosensitive material when the light is projected onto the slidefilm. Therefore, any variation in the thickness of the mount held in the slide holder will lead to a variation in the distance between the photosensitive material and the film of the slidefilm held in the slide holder disposed at a designated position. As a result, the light transmitted through the film may not be accurately focused onto the exposure point on the photosensitive material.

In the projection unit, the light transmitted through the slidefilm is focused onto the exposure point on the photosensitive material by means of a projection lens. It may be possible to make the focal length of the projection lens variable so that the light transmitted through the film of the slidefilm can be accurately focused onto the exposure point on the photosensitive material. However, a projection lens of a variable focal length is not desirable because it requires a complicated construction. Also, even if the focal length of the projection lens is made variable, it will not be an easy task to adjust the focal length of the projection lens by checking the focusing state of the light transmitted through the slidefilm on the exposure point.

Since the film of the slidefilm is small in size, i.e., usually 1 to 2 cm on one side, the slidefilm image is enlarged for copying. In a copying machine capable of enlarged copying of the document image, the position of the lens in the optical system that scans the document image and the moving speed of the photosensitive material are varied to accomplish copying of the document image enlarged in a specified magnification ratio. With the projection unit installed in such a copying machine, the slidefilm image is enlarged for copying when the moving speed of the photosensitive material is set at a faster speed than the moving speed of the slidefilm with respect to the light source. Thus, with the copying machine capable of enlarged copying of the document image, the enlarged copy image of the small slidefilm can be easily produced.

The film of the slidefilm is usually of a rectangular shape having different lengths between the two pairs of opposite sides thereof. Accordingly, the slidefilm is supported in the slide holder with either the lengthwise or widthwise direction of the film aligned with the moving direction of the photosensitive material, and the magnification ratio is set on the basis of the film length that is aligned with the moving direction of the photosensitive material. Therefore, an accurately enlarged copy image cannot be obtained unless the film of the slidefilm is correctly supported in a prescribed state in the slide holder.

SUMMARY OF THE INVENTION

The projection unit of this invention, which overcomes the above-discussed and numerous other disadvantages and deficiencies of the prior art, is mounted in a copying machine and used to project an image of a light permeable original onto a prescribed exposure point on a photosensitive material, the projection unit comprising a light source for exposure which is installed in a box, an original holding means which holds the original in a prescribed position with respect to the light source for exposure and the photosensitive material, and is disposed movably in the box so that the image of the original held in the original holding means is scanned in a prescribed direction with respect to the photosensitive material, a driving means for moving the original holding means in the scanning direction, a transmission means which is provided between the original holding means and the driving means and is capable of moving between an engaged position in that the transmission means is coupled to the original holding means and the driving means so as to transmit power of the driving means to the holding means and a disengaged position in that the transmission means is not coupled to the original holding means and the driving means, and a switching means for putting the transmission means in the engaged position or disengaged position.

In a preferred embodiment, the original holding means is provided with a operation member stretching from the inside of the box and is moved by manual operation of the operation member.

In a preferred embodiment, the original holding means is provided with a manual operation detecting means which detects the operation member being operated, and the switching means is controlled on the basis of the result detected by the manual operation detecting means.

In a preferred embodiment, the box is provided with an opening through which the original is inserted.

In a preferred embodiment, the original holding means is moved to an original mounting position near to the opening so that the original inserted through the opening is mounted on the original holding means.

In a preferred embodiment, the opening is opened and closed by means of a shutter.

In a preferred embodiment, an original mounting position detecting means is provided in the moving range of the original holding means for detecting if the original holding means reaches the original mounting position, and the shutter opens or closes the opening on the basis of the result detected by the original mounting position detecting means.

In a preferred embodiment, the original holding means is provided with an original mounting state detecting means which detects if the original is correctly mounted on the original holding means, and a prescribed announcing means is operated when the original mounting state detecting means detects that the original is not correctly mounted in the original holding means.

In a preferred embodiment, the original comprises a film and a mount which sandwiches the periphery of the film in the direction of the thickness thereof.

In a preferred embodiment, the original holding means comprises a pair of slide holders which sandwich the mount of the slidefilm orthogonal to the direction of the thickness of the mount, each of the slide holders being urged in the direction closer to each other.

In a preferred embodiment, the slide holders are provided with V-shaped grooves at their inside ends facing each other, in which the prescribed sides of the mount of the slidefilm are fitted, respectively.

Thus, the invention described herein makes possible the objectives of (1) providing a projection unit in which an original holding means can be readily moved to a prescribed position by manual operation so as to hold an original securely therein; (2) providing a projection unit in which an opening through which an original is inserted for mounting on an original holding means is closed by means of a shutter when light is projected onto the original, thereby avoiding effects of external light; (3) providing a projection unit in which an annunciation is issued when an original is not held in an original holding means in a prescribed position, thereby avoiding production of a copy image of an improperly positioned original; and (4) providing a projecting unit in which, when an original is a slidefilm, a mount of the slidefilm is held on both sides by slide holders, each of which being provided with a V-shaped groove in that the side of the mount is fitted, thereby holding the film in a prescribed position at all times even if the thickness of the mount varies.

BRIEF DESCRIPTION OF THE DRAWINGS

This invention may be better understood and its numerous objects and advantages will become apparent to those skilled in the art by reference to the accompanying drawings as follows:

FIG. 8A is a sectional view of the slide holder in the projection unit, FIG. 8B is a front view of the same, and FIG. 8C is a front view illustrating the operation of the same.

DESCRIPTION OF THE PREFERRED EMBODIMENTS

Figure 2:
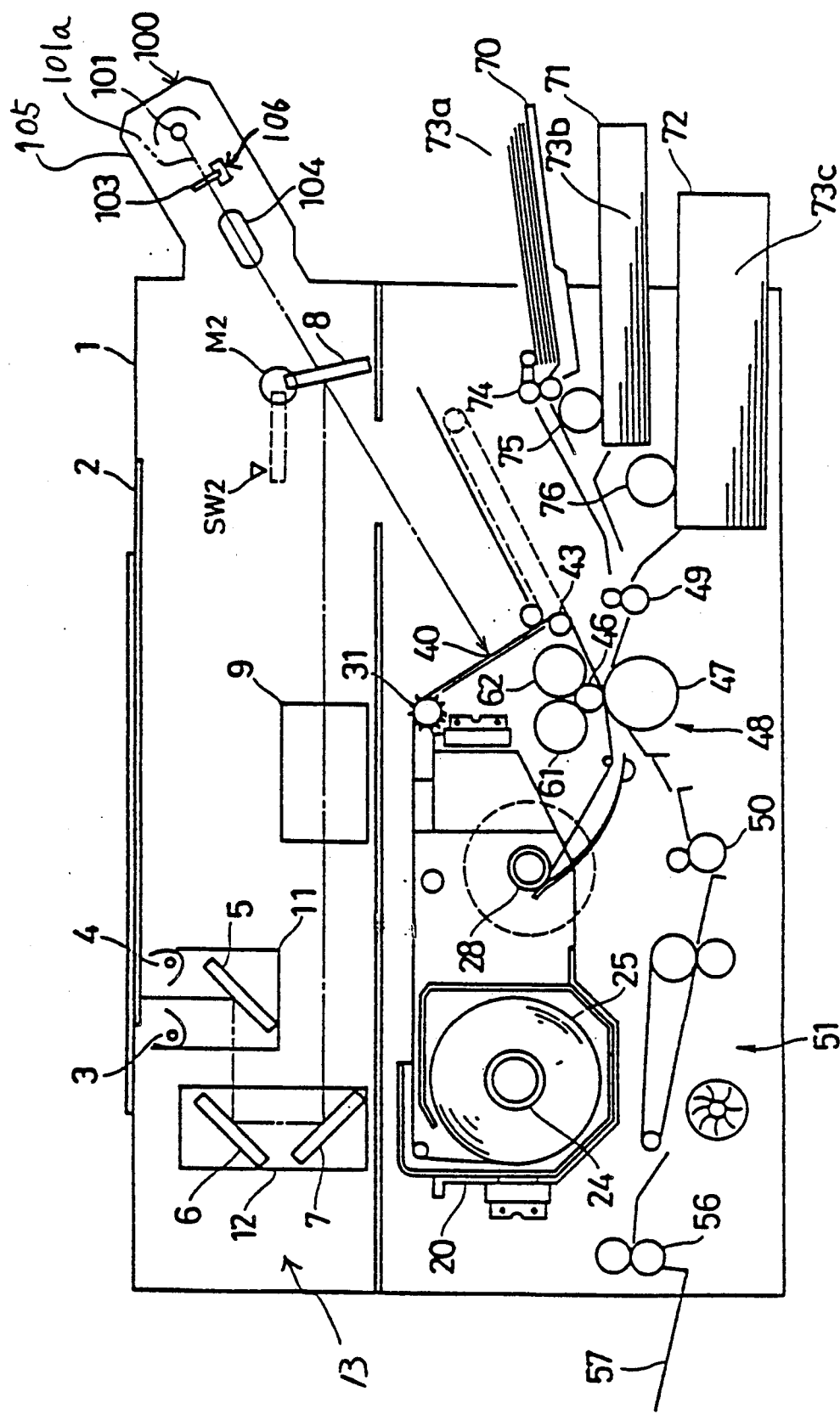
FIG. 2 is a structural view of a copying machine mounted with the projection unit of FIG. 1.

FIG. 2 shows the construction of a copying machine mounted with a projection unit of the present invention. The copying machine 1 has a document table 2 disposed on the top surface thereof. A document to be copied is placed on the document table 2. Disposed under the document table 2 is an optical system 13 for scanning the document placed on the document table 2. The optical system 13 comprises a pair of copy lamps 3 and 4 for illuminating the document placed on the document table 2, three mirrors 5, 6, and 7 for reflecting the light illuminated from the copy lamps 3 and 4 and reflected from the document, a lens 9 through which the light reflected from the mirror 7 passes, and a mirror 8 for reflecting the light passed through the lens 9 onto a prescribed exposure point 40. The pair of copy lamps 3 and 4 and the mirror 5 are mounted on a moving member 11, while the pair of mirrors 6 and 7 are mounted on a moving member 12. The moving members 11 and 12 respectively move in both left and right directions under and parallel to the document table 2. The document placed on the document table 2 is scanned with light when the moving members 11 and 12 move along the document table 2. The mirror 8 which reflects the light reflected from the document and passed through the lens 9 onto the exposure point 40 is mounted swingably, and is swung to rest in a position indicated by a dotted line in FIG. 2 by a motor M2.

Mounted below the optical system 13 is a cartridge 20 in which a rolled photosensitive sheet 25 is accommodated. The photosensitive sheet 25 is coated on its surface with pressure-rupturable capsules of 10 to 20 μm in diameter containing leuco dyes and photohardening materials.

The photosensitive sheet 25 is pulled out of the cartridge 20 mounted below the optical system 13, and is applied on rollers 31 and 43. The exposure point 40 on the photosensitive sheet 25 is placed between the rollers 31 and 43. The image of the document placed on the document table 2 is projected onto the exposure point 40 by means of the optical system 13. When the light illuminates the photosensitive sheet 25, some of the pressure-rupturable capsules coated thereon which are exposed to the light are harden, thus forming a latent image formed with selectively hardened pressure-rupturable capsules on the surface of the photosensitive sheet 25.

The photosensitive sheet 25 applied on the roller 43 is passed through a pressure unit 48 disposed in the approximately middle part of the copying machine 1 before being taken up on a takeup rod 28. The pressure unit 48 comprises a pair of pressure rollers 46 and 47 disposed parallel to each other between which the photosensitive sheet 25 is passed. The upper pressure roller 46 is pressed against the lower pressure roller 47 with a prescribed pressure by means of a pair of auxiliary rollers 61 and 62.

A manual paper feed tray 70 is mounted on one side of the copying machine 1. Below the manual paper feed tray 70, a pair of paper cassettes 71 and 72 are mounted one above the other. Either one of image receiving sheets 73a placed on the manual paper feed tray 70, image receiving sheets 73b held in the paper cassette 71 or image receiving sheets 73c in the paper cassette 72 is selectively fed into the copying machine 1. The image receiving sheets 73a on the manual paper feed tray 70 are fed one by one into the copying machine 1 by means of a paper feed roller 74, while the image receiving sheets 73b and 73c in the respective paper cassettes 71 and 72 are fed one by one into the copying machine 1 by means of respective paper feed rollers 75 and 76. Each of the image receiving sheets 73a, 73b and 73c is coated on its surface with developing material and thermoplastic resin. The developing material reacts with the leuco dyes contained in the pressure-rupturable capsules coated on the surface of the photosensitive sheet 25 to give colors.

The image receiving sheet fed into the copying machine 1 is passed between the pressure rollers 46 and 47 in the pressure unit 48 with the surface coated with developing material contacting the surface of the photosensitive sheet 25 coated with the pressure-rupturable capsules. While the two sheets, one superposed on the other, are passed through the pressure rollers 46 and 47, the unhardened pressure-rupturable capsules on the photosensitive sheet 25 are ruptured, causing the leuco dyes contained in the pressure-rupturable capsules to flow out onto the surface of the image receiving sheet. The leuco dyes thus flowing out react with the developing material on the image receiving sheet to give it colors, thereby forming an image on the image receiving sheet.

The image receiving sheet on which the image is formed is transported to a heating unit 51 where the image receiving sheet is heated. When the image receiving sheet is heated, the thermoplastic resin coated thereon melts to give glossiness to the image formed on the image receiving sheet. The image receiving sheet passed through the heating unit 51 is discharged onto a paper ejection tray 57 by means of a paper ejection roller 56.

Upward of the manual paper feed tray 70 mounted on one side of the copying machine 1, a projection unit 100 is installed. The projection unit 100 comprises a light source 101, an original holding means 106 for holding a slidefilm 103 which is used as a light permeable original, and a projection lens 104, all of which are housed in a box 105. The light source 101 projects light through the projection lens 104 straight onto the exposure point 40 on the photosensitive sheet 25 in the copying machine 1. When the slidefilm 103 is illuminated by the light source 101, the mirror 8 of the optical system 13 is moved by means of a motor M2 to rest in the position indicated by the dotted line in FIG. 2 so that the light projected from the light source 101 and passed through the projection lens 104 reaches the exposure point 40 on the photosensitive sheet 25 without being obstructed by the mirror 8. A switch SW2 is activated when the mirror 8 is moved to the position indicated by the dotted line in FIG. 2. The original holding means 106 includes a pair of slide holders 102 and 102 which hold the slidefilm 103 in such a way as to interpose between the light source 101 and the projection lens 104 and orthogonal to an optical axis 101a of the light source 101 and projection lens 104. The slidefilm 103 supported in the slide holders 102 is illuminated by the light source 101 while being moved orthogonal to the optical axis 101a and diagonally upward in FIG. 2.

Figure 1:
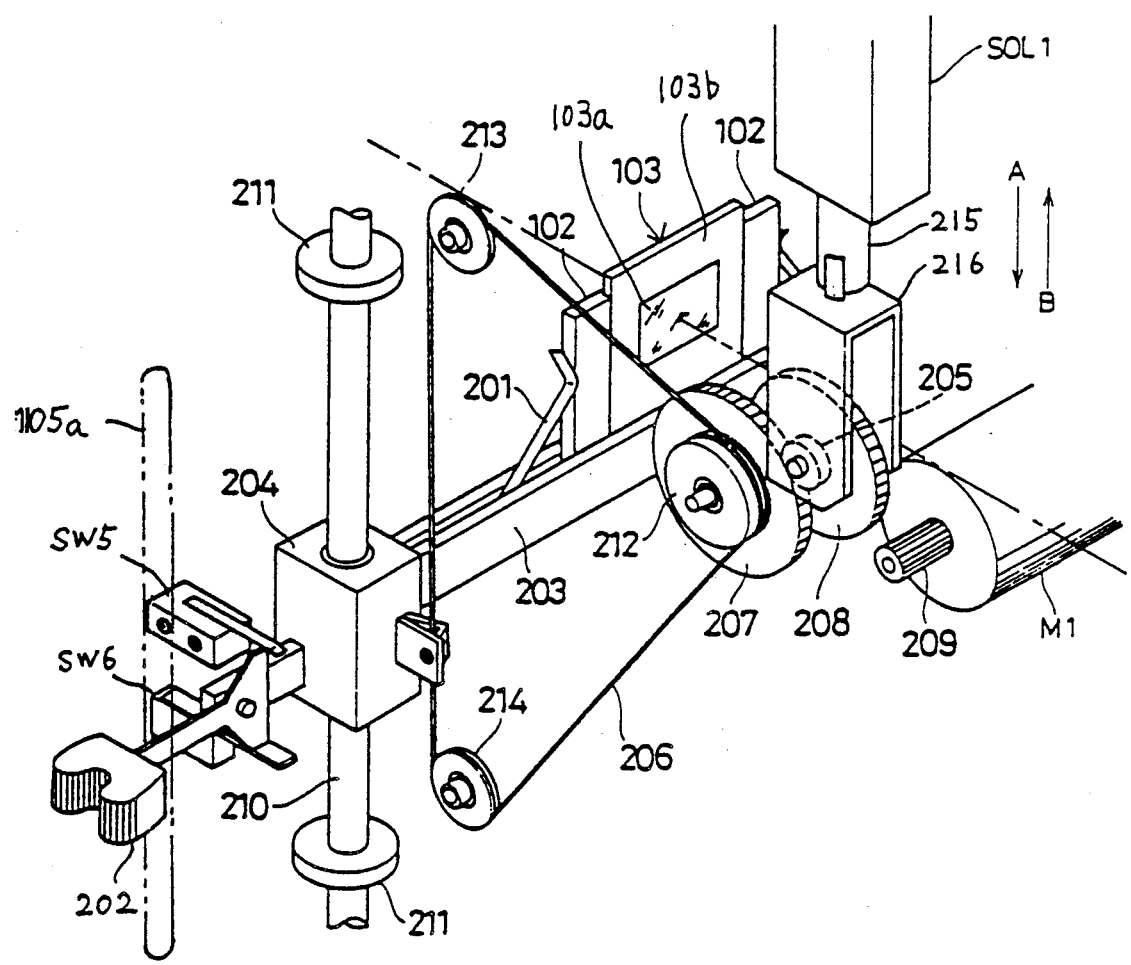
FIG. 1 is a perspective view showing an important section of a projection unit of the present invention.
Figure 3:
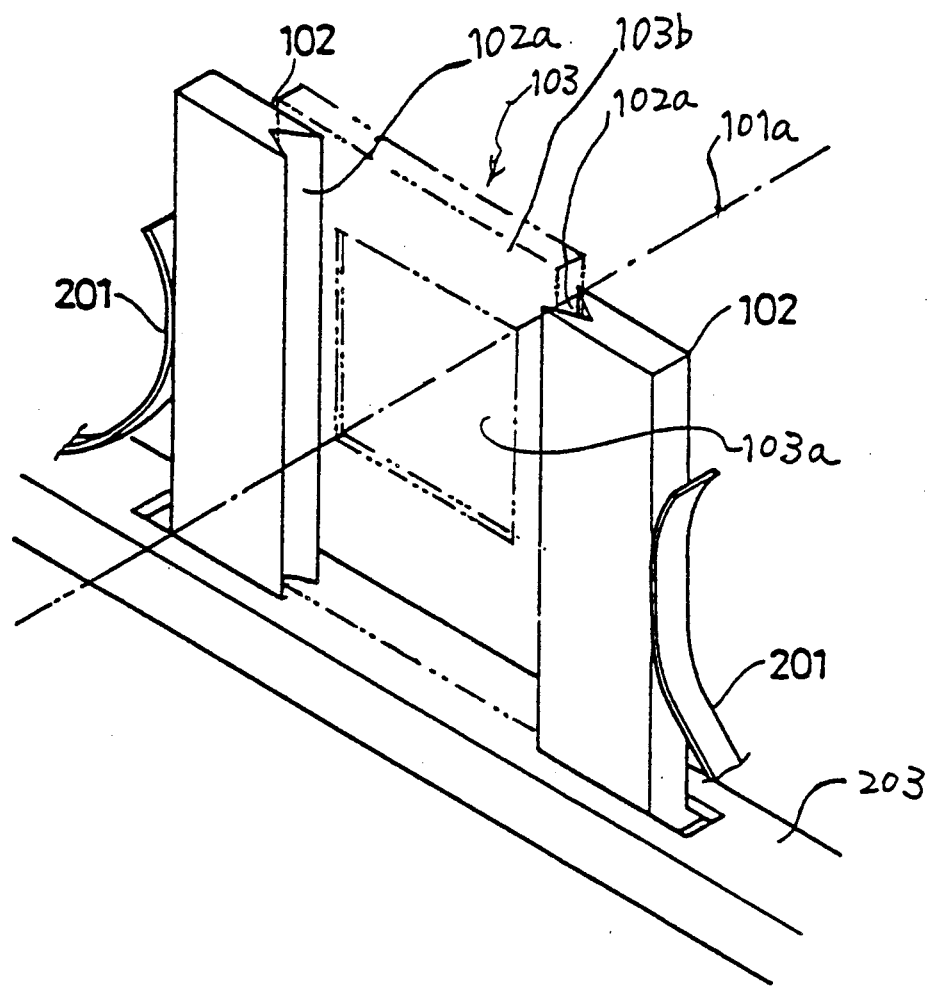
FIG. 3 is a perspective view showing a slide holder of the projection unit of FIG. 1.

As shown in FIG. 1, the pair of slide holders 102 and 102 are mounted on a support base 203. The support base 203 extends almost horizontally in the direction orthogonal to the optical axis 101a of the light source 101. As shown in FIG. 3, the slide holders 102 are of a planar shape and positioned on a plane orthogonal to the optical axis 101a of the light source 101. The slide holders 102 are mounted, being suitably spaced apart from each other, on the support base 203. The slide holders 102 are mounted on the support base 203 in such a way that they can be moved in both directions closer to and apart from each other by a prescribed distance. The slide holders 102 are pushed in the direction closer to each other by means of plate springs 201 and 201. The slide holders 102 are provided with V-shaped grooves 102a at their inside ends facing each other.

The slidefilm 103 supported on the slide holders 102 comprises a rectangular-shaped thin film 103a and a frame-like mount 103b which sandwiches the periphery of the film 103a across the thickness thereof, the film 103a being positioned in the center when viewed across the thickness of the mount 103b. The sides of the mount 103b of the slidefilm 103 are fitted in the grooves 102a of the slide holders 102. Thus, the slidefilm 103 is supported on the slide holders 102 in such a way as to intercept the optical axis 101a of the light source 101 at right angles.

Figure 4A:
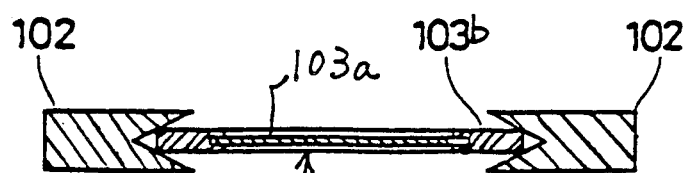
FIGS. 4A and 4B are sectional views showing the relationship between the slide holder and a slidefilm supported therein, respectively.
Figure 4B:
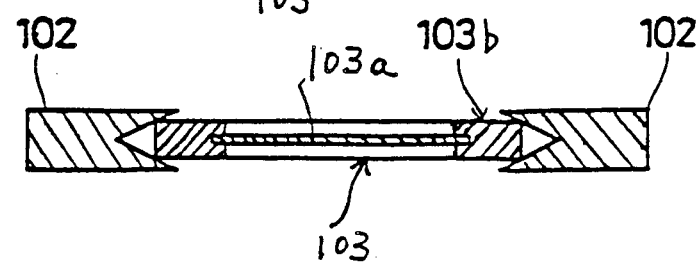

The slidefilm 103 has the film 103a positioned in the center when viewed across the thickness of the mount 103b. As shown in FIGS. 4A and 4B, the mounts 103b of different thicknesses are supported at different points in the V-shaped grooves 102a of the slide holders 102, but the film 103a is always positioned in the center when viewed across the thickness of the slide holders 102. This means that the film 103a of the slidefilm 103 is always supported on the slide holders 102 in a prescribed position with respect to the light source 101 and projection lens 104.

The support base 203 supporting the slide holders 102 thereon is fixed to a guide block 204, as shown in FIG. 1. The guide block 204 is slidably fitted on a guide shaft 210 extending in the direction orthogonal to the optical axis 101a of the light source 101 (in the diagonally vertical direction in FIG. 2). Mounted on the upper and lower parts of the guide shaft 210 are stoppers 211 and 211 that limit the movement of the guide block 204 at respective positions, respectively. A wire 206 is installed to the guide block 204. The guide block 204 is moved along the guide shaft 210 by means of the wire 206. The wire 206 is wound on three pulleys 212, 213, and 214. A driven gear 207 is installed to the pulley 212 on the same axis in an integral fashion. The driven gear 207 is engaged with a transmission gear 205. A reduction gear 208 is installed to the transmission gear 205 on the same axis in an integral fashion. The reduction gear 208 is engaged with a driving gear 209 fixed to the rotation axis of a motor M1. Thus, the transmission gear 205 and reduction gear 208 constitute a transmission means between the motor M1 and the driven gear 207. The transmission gear 205 and the reduction gear 208 are supported on a bracket 216 which is fixed to a plunger 215 of a solenoid SOL1 that serves as a switching means. The solenoid SOL1 is installed so that the plunger 215 moves in directions indicated by arrows A and B. The plunger 215 is moved in the direction A by means of a spring (not shown) when the solenoid SOL1 is in an unenergized state. This causes the transmission gear 205 fitted to the bracket 216 to engage the driven gear 207 while the reduction gear 208 engages the driving gear 209, thus putting the transmission means in an engaged condition. On the other hand, when the solenoid SOL1 is energized, the plunger 215 is moved in the direction B, which causes the transmission gear 205 and reduction gear 208 to disengage from the driven gear 207 and driving gear 209 respectively, thus putting the transmission means in a disengaged condition.

The motor M1 is rotatable in both forward and reverse directions to move the support base 203 vertically along the guide shaft 210.

The guide block 204 is provided with an operation lever 202 for moving the guide block 204 by manual operation. The operation lever 202 extends from the guide block 204 in the direction opposite to the extending direction of the support base 203, and stretches through an elongated hole 105a to the exterior of the box 105 of the projection unit 100. The elongated hole 105a is formed in parallel to the guide shaft 210 and the operation lever 202 is moved vertically along the elongated hole 105a to move the guide block 204 vertically along the guide shaft 210, thus moving the support base 203 vertically.

The operation lever 202 is slightly swingable in vertical directions along the elongated hole 105a. When the operation lever 202 is moved upward or downward along the elongated hole 105a, the operation lever 202 is swung upward or downward by a prescribed amount.

A pair of switches SW5 and SW6 are mounted on the guide block 204 by means of a supporting member (not shown). The switches SW5 and SW6 move integrally with the guide block 204. The switches SW5 and SW6 are respectively mounted upward and downward of the operation lever 202, which activates the switch SW5 when moved upward and the switch SW6 when moved downward. Thus, the switches SW5 and SW6 constitute a manual operation detecting means for detecting the upward and downward swinging motion of the operation lever 202 through the activation of the respective switches SW5 and SW6. As will be described later, when either one of the switches SW5 or SW6 is activated, power is cut off to the solenoid SOL1.

Figure 5:
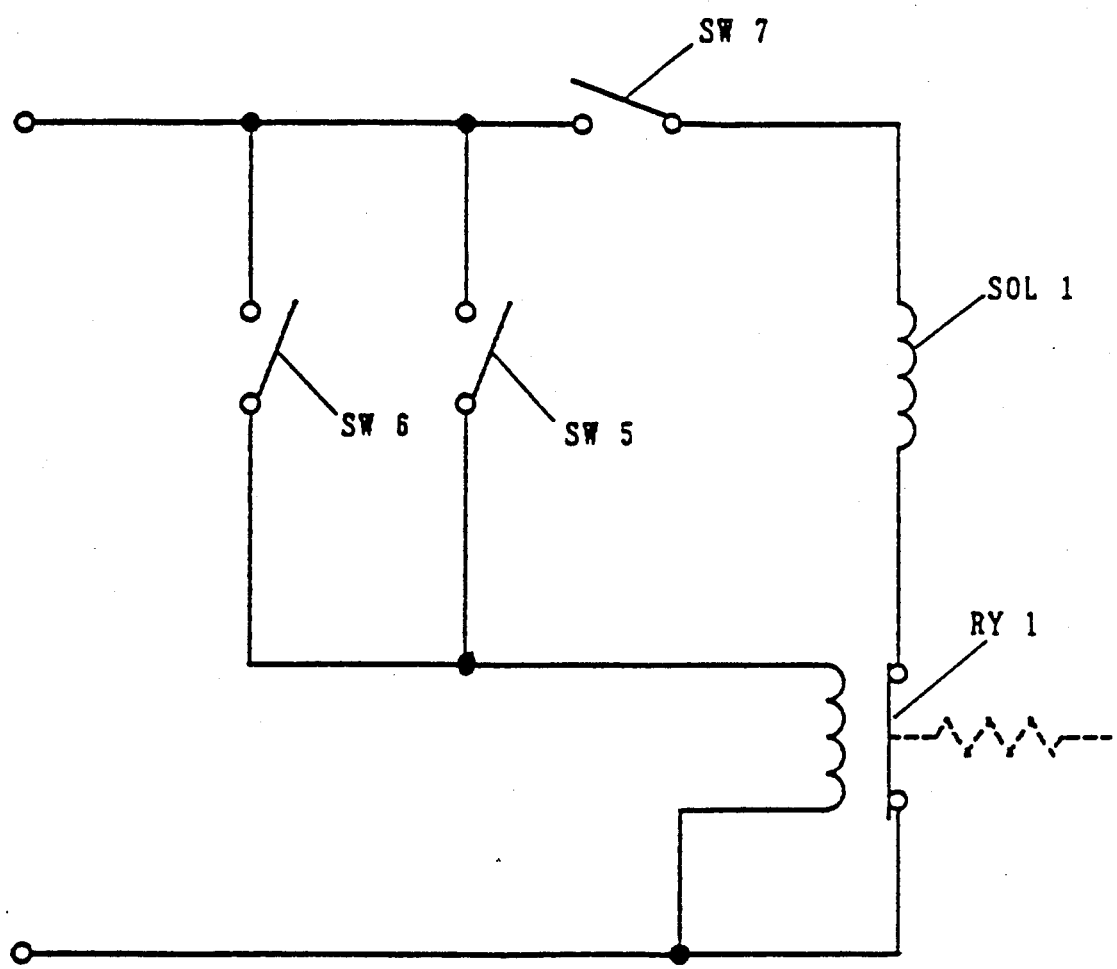
FIG. 5 is a driving circuit diagram of a solenoid SOL1.

As shown in FIG. 5, the switches SW5 and SW6 are disposed in such a way as to control the energization of a relay RY1 that controls the activation of the solenoid SOL1. The solenoid SOL1 is connected in series with the main switch SW7 of the copying machine and the normally closed contact of the relay RY1, while the switches SW5 and SW6 are connected in parallel with each other. Connected directly to the coil of the relay RY1, the parallel circuit of the switches SW5 and SW6 is connected in parallel with the series circuit comprising the main switch SW7, the solenoid SOL1, and the normally closed contact of the relay RY1. Therefore, as described previously, when the main switch SW7 is turned on, the solenoid SOL1 is energized to couple the driven gear 207 to the motor M1 via the transmission gear 205 and reduction gear 208, and when the main switch SW7 is turned off, the driven gear 207 is disconnected from the motor M1. Further, even if the main switch SW7 is in the ON state, when the operation lever 202 is operated, the driven gear 207 is disconnected from the motor M1. That is, when the operation lever 202 is moved upward or downward, the switch SW5 or SW6 is activated to energize the coil of the relay RY1, causing the normally closed contact to open. This causes power to be cut off to the solenoid SOL1, disconnecting the driven gear 207 from the motor M1.

Figure 6:
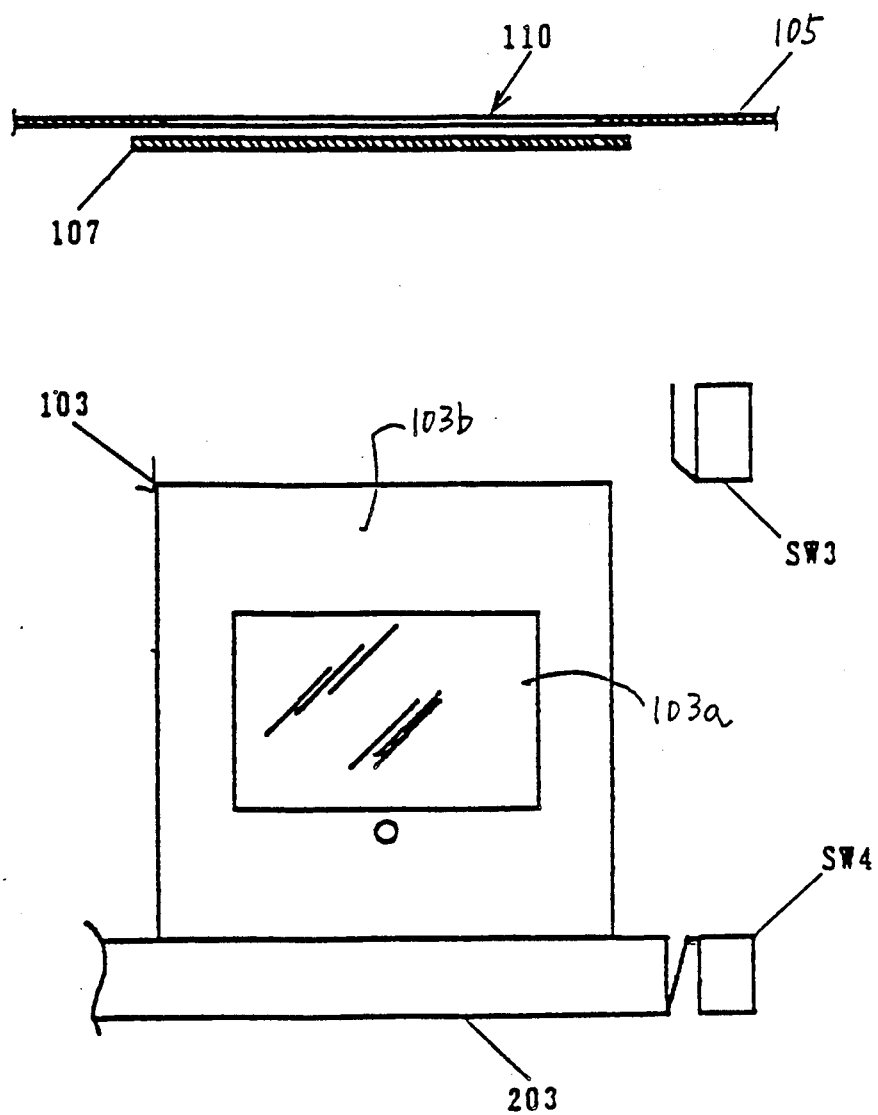
FIG. 6 is a front view showing an important section of the projection unit.

As shown in FIG. 6, disposed in the moving range where the support base 203 moves along the guide shaft 210 are a switch SW3 for detecting the support base 203 reaching the upper limit position of its moving direction and a switch SW4 for detecting the support base 203 reaching the lower limit position of its moving direction. The switches SW3 and SW4 are activated by contact with the support base 203 which reaches the upper and lower limit positions respectively.

The support base 203 is disposed facing the top panel of the box 105 of the projection unit 100. An opening 110 is provided in the top panel of the box 105. The opening 110 is disposed facing the slidefilm 103 held in the slide holders 102 supported on the support base 203. With the support base 203 moved to the upper limit position, the slidefilm 103 is mounted on or removed from the slide holders 102 through the opening 110. Therefore, the upper limit position of the support base 203 also serves as the mounting position of the slidefilm 103, the switch SW3 constituting a means for detecting the mounting position of the slidefilm 103.

Disposed under the opening 110 is a shutter 107 for opening and closing the opening 110. The shutter 107 is slidable in directions indicated by arrows E and F in FIG. 7. The shutter 107 is provided with an opening 107a. When the shutter 107 is moved in the direction E, the opening 107a is positioned to superpose with the opening 110 provided in the box 105, thus putting the opening 110 in an opened state. Conversely, when the shutter 107 is moved in the direction F, the opening 110 of the box 105 is closed with the shutter 107 The shutter 107 is urged in the direction F by means of a spring 108. Also, the shutter 107 is linked to a plunger 113 of a solenoid SOL2 by means of links 111 and 112. The plunger 113 of the solenoid SOL2 is movable in directions indicated by arrows C and D, and when the solenoid SOL2 is in an unenergized state, the plunger 113 is pulled in the direction D by the force of the spring 108, thus placing the shutter 107 in a position to close the opening 110 of the box 105. On the other hand, when the solenoid SOL2 is energized, the plunger 113 is moved in the direction C, causing the shutter 107 to move in the direction E overcoming the force of the spring 108. This causes the opening 107a of the shutter 107 to be superposed with the opening 110 of the box 105, thus allowing the interior and exterior of the box 105 to communicate with each other through the openings 107a and 110.

As shown in FIGS. 8A and 8B, in the moving range of the support base 203 which supports the slide holders 102 thereon, a sensor S1 is disposed which has a light-emitting element 115 and a light-receiving element 116. The sensor S1 constitutes a means for detecting mounting state of a slidefilm which detects if the slidefilm 103 is mounted in a prescribed state on the slide holders 102 when the support base 203 is positioned at its lower limit position. The light-emitting element 115 and light-receiving element 116 of the sensor S1 are disposed opposite each other across the slidefilm 103 with the support base 203 at its lower limit position. When the slidefilm 103 is correctly mounted on the slide holders 102 with the longer side of the film 103a positioned horizontally. the light-emitting element 115 and the light-receiving element 116 face the lower part of the mount 103b. On the other hand, as shown in FIG. 8C, when the slidefilm 103 is incorrectly mounted on the slide holders 102 with the shorter side of the film 103a positioned horizontally, the light-emitting element 115 and the light-receiving element 116 face the film 103a. Therefore, when the support base 203 is set at its lower limit position with the slidefilm 103 correctly mounted on the slide holders 102, the light emitted from the light-emitting element 115 is blocked by the mount 103b and does not reach the light-receiving element 116. On the other hand, when the support base 203 is set at its lower limit position with the slidefilm 103 incorrectly mounted on the slide holders 102 or with no slidefilm 103 mounted on the slide holders 102, the light emitted from the light-emitting element 115 passes through the film 103a, or is not blocked by the slidefilm 103, and reaches the light-receiving element 116.

Figure 9:
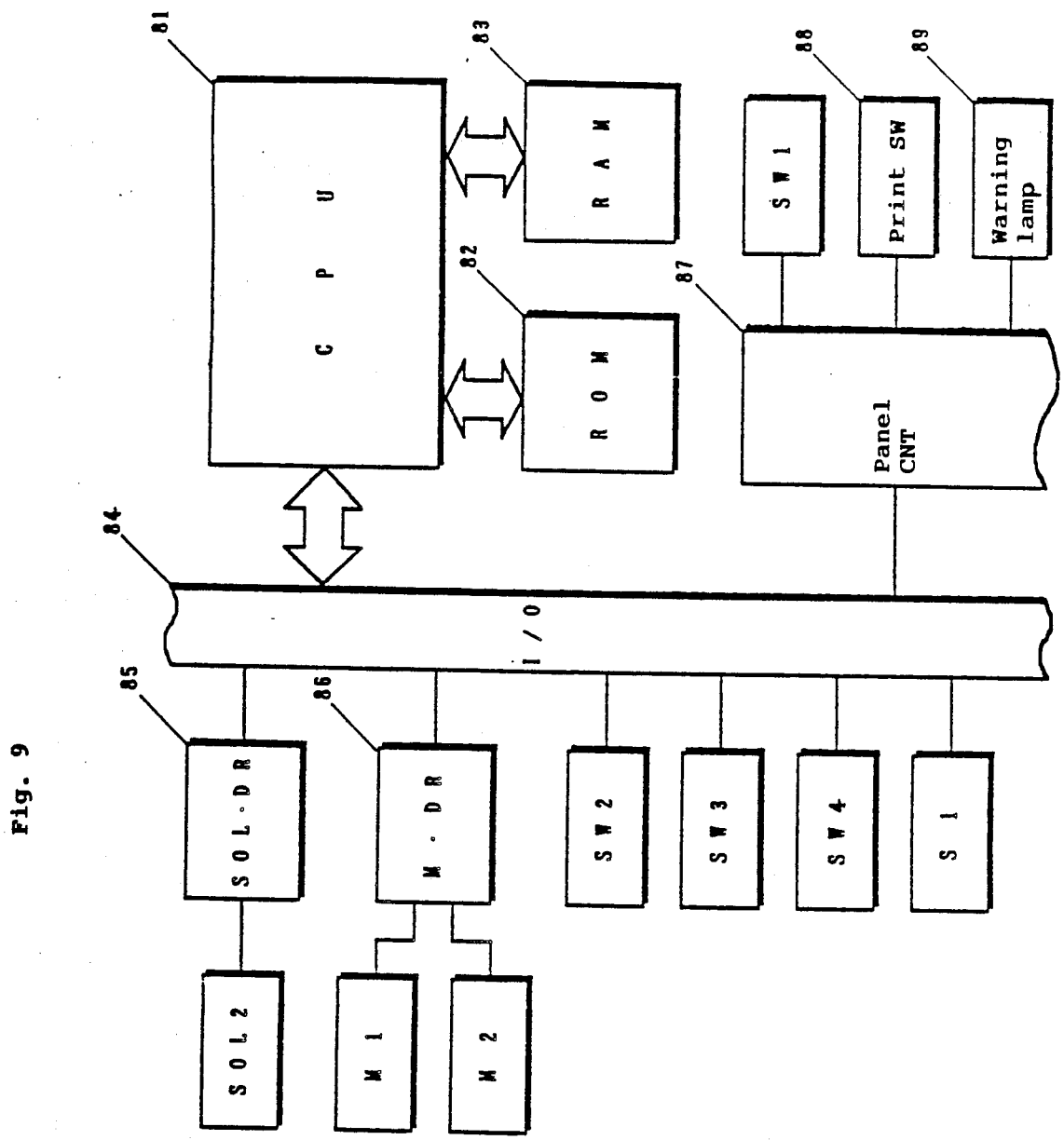
FIG. 9 is a block diagram of a control system for the projection unit.

FIG. 9 is a block diagram of the control system for the projection unit. A CPU 81 is connected to an I/O interface 84 through which the outputs from the switches SW2, SW3, and SW4 and the sensor S1 are supplied. The switch SW2 is activated when the mirror 8 in the optical system 13 is swung to the position indicated by the dotted line in FIG. 2. The switches SW3 and SW4 are respectively activated when the support base 203 supporting the pair of slide holders 102 and 102 thereon has reached the upper and lower limit positions, as shown in FIG. 6. The sensor S1 is activated when the slidefilm 103 is not correctly mounted on the slide holders 102, as shown in FIG. 8C. Also connected to the I/O interface 84 is a panel controller 87 which is coupled to an operation panel (not shown) provided on the top surface of the copying machine 1. The operation panel is provided with a switch SW1, a print switch 88, a warning lamp 89, etc. The switch SW1 is operated when the projection unit 100 is used. The print switch 88 is pressed to start a copy operation. The warning lamp 89 is made to light when the slidefilm 103 is not correctly mounted on the slide holders 102.

Figure 7:
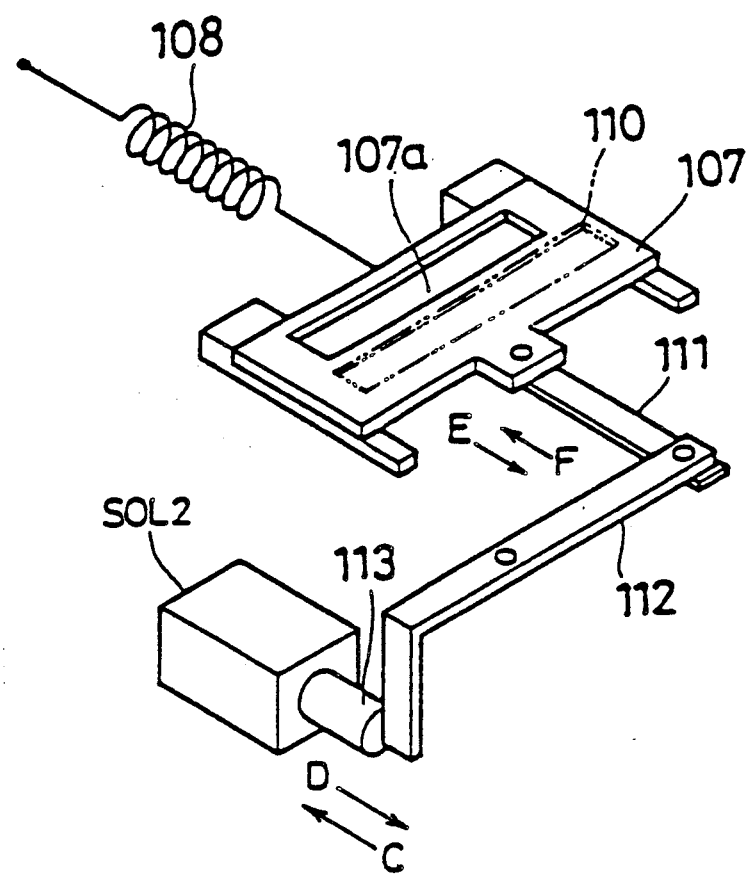
FIG. 7 is a perspective view showing the construction in the vicinity of a shutter of the projection unit.

Furthermore, a solenoid driver 85 for driving the solenoid SOL2 and a motor driver 86 for driving the motors M1 and M2 are connected to the I/O interface 84. The solenoid SOL2 is used to drive the shutter 107, as shown in FIG. 7. The motor M1 is used to vertically move the support base 203 supporting the slide holders 102 thereon, as shown in FIG. 1, while the motor M2 is used to swing the mirror 8 in the optical system 13. A RAM 83 is connected to the CPU 81. Part of the memory area of the RAM 83 is allocated as a working area for control data outputs.

Figure 10:
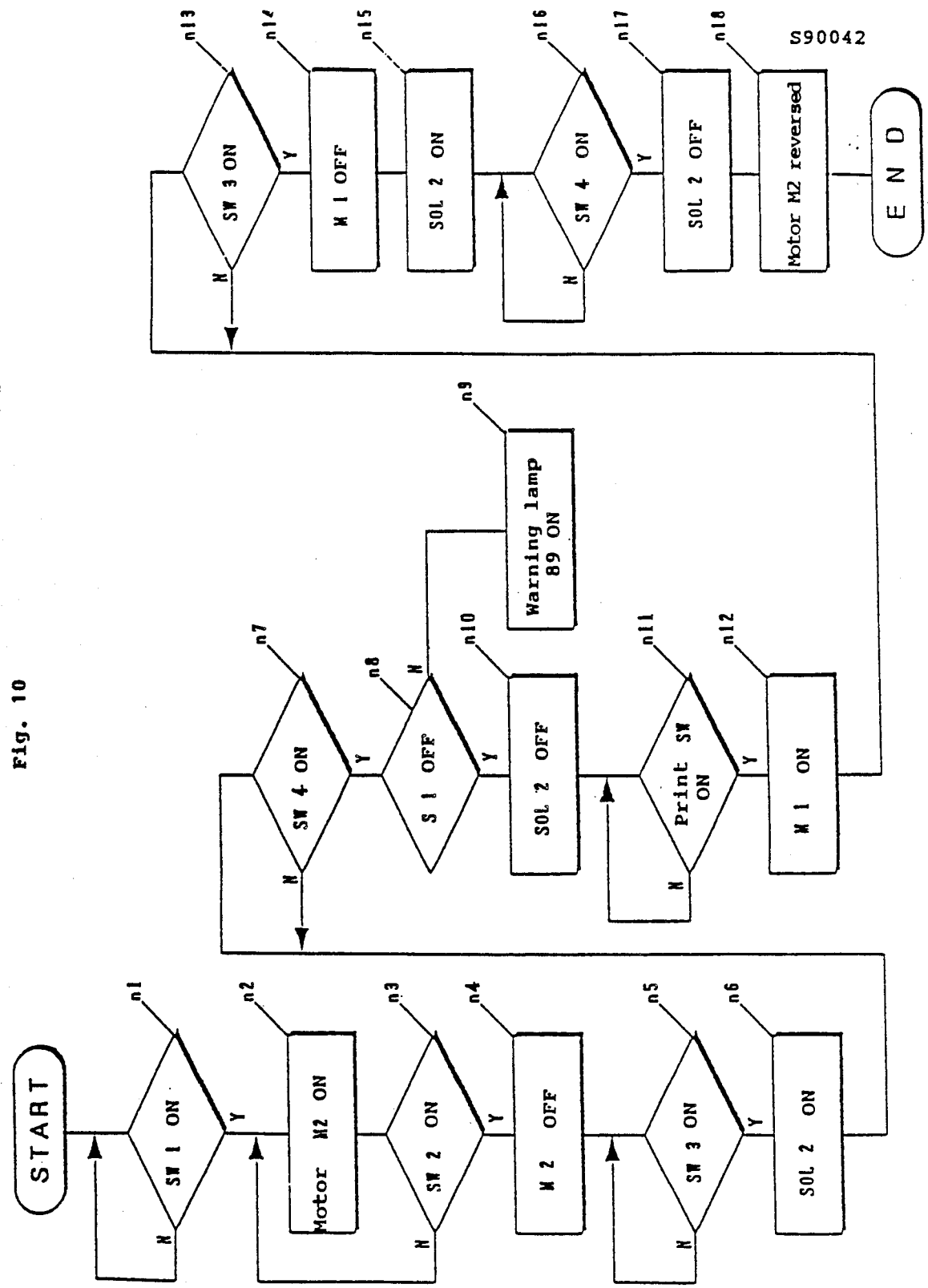
FIG. 10 is a flowchart illustrating the operation of the projection unit of the invention.

The CPU 81 controls the solenoid driver 85 and motor driver 86 in accordance with a program previously written in a ROM 82 and on the basis of the signals supplied from the switches SW1, SW2, SW3 and SW4, the print switch 88, the sensor S1, etc. The processing by the CPU 81 is now described with reference to a flowchart shown in FIG. 10. When the main switch SW7 is pressed to turn the power on, the CPU 81 is placed in a wait state until the switch SW1 is operated. Turning on the main switch SW7 energizes the solenoid SOL1, which causes the motor M1 for driving the support base 203 supporting the slide holders 102 thereon to be coupled to the driven gear 207 via the reduction gear 208 and transmission gear 205.

In this situation, when the switch SW1 is operated (n1) to copy a slidefilm using the projection unit 100, the motor M2 is driven (n2) so that the mirror 8 in the optical system 13 is swung outside the illumination range of the light source 101. Thereafter, the state of the switch SW2 is fetched (n3), and when the switch SW2 is activated, the motor M2 is turned off (n4). This completes the operation to rest the mirror 8 in a retracted position indicated by the dotted line in FIG. 2.

In the meantime, the operation lever 202 is moved upward for manual operation of the support base 203 supporting the slide holders 102 thereon, the support base 203 being moved upward along the guide shaft 210. When the operation lever 202 is moved upward, the switch SW5 in the driving circuit for the solenoid SOL1 is activated to de-energize the solenoid SOL1, causing the plunger 215 of the solenoid SOL1 to move in the direction indicated by the arrow A in FIG. 1. This causes the support base 203 and motor M1 to disengage from the transmission gear 205 and reduction gear 208 respectively, allowing the support base 203 to be easily moved upward by manual operation.

When the support base 203 is thus moved upward by manual operation, the CPU 81 fetches the state of the switch SW3 that detects the support base 203 reaching the upper limit position (n5). When the switch SW3 is activated with the support base 203 reaching the upper limit position, the solenoid SOL2 is put into operation (n6). The solenoid SOL2 operates to pull the shutter 107 disposed above the support base 203 in the direction indicated by the arrow E in FIG. 7, positioning the opening 107a of the shutter 107 to be superposed with the opening 110 in the top panel of the box 105, and thus putting the opening 110 in an opened condition.

In this condition, the slidefilm 103 is inserted through the opening 110 into the box 105 so as to be mounted on the pair of slide holders 102 on the support base 203.

After the slidefilm 103 has been mounted on the slide holders 102, the operation lever 202 is moved downward to move the support base 203 downward along the guide shaft 210. At this time also, since the operation of the operation lever 202 activates the switch SW6 to de-energize the solenoid SOL1, the support base 203 and motor M1 are disengaged from the transmission gear 205 and reduction gear 208 respectively, allowing the support base 203 to be easily moved downward by manual operation.

After the solenoid SOL2 is energized, the CPU 81 fetches the state of the switch SW4 that detects the support base 203 reaching the lower limit position (n7). When the SW4 is activated with the support base 203 manually moved down to the prescribed lower limit position, the CPU 81 fetches the state of the sensor S1 that senses if the slidefilm 103 is correctly mounted on the slide holders 102 (n8). If the slidefilm 103 is incorrectly mounted on the slide holders 102 with the shorter side of the film 103a positioned horizontally, the sensor S1 is activated to turn on the warning lamp 89 (n9), annunciating that the slidefilm 103 is incorrectly mounted on the slide holders 102. When the slidefilm 103 is correctly mounted on the slide holders 102 with the longer side of the film 103a positioned horizontally, the solenoid SOL2 is turned off (n10). This allows the shutter 107 to be pulled by the spring 108, the opening 110 in the top panel of the box 105 being closed by the shutter 107.

Thereafter, the CPU 81 fetches the state of the print switch 88 (n11), and is put in a wait state until the print switch 88 is turned on. When the print switch 88 is turned on, the motor M1 for driving the support base 203 is energized (n12). At this time, since the downward movement of the support base 203 by the manual operation of the operation lever 202 is completed, the operation lever 202 is in a nonoperating condition, therefore, the switches SW5 and SW6 are in a de-activated state. As a result, since the solenoid SOL1 is in the energized state, the support base 203 is coupled to the motor M1. In this situation, the motor M1 is driven to move the support base 203 upward along the guide shaft 210. The support base 203 moves upward at a prescribed speed. At the same time that the motor is driven, the light source 101 is turned on, while the photosensitive sheet 25 loaded in the copying machine 1 is moved at a prescribed speed. As a result, the image on the film 103a of the slidefilm 103 is projected through the projection lens 104 onto the exposure point 40 on the photosensitive sheet 25 moving at the prescribed speed, the image being projected at a prescribed speed with respect to the photosensitive sheet 25 in the same direction as the moving direction thereof. At this time, the copying machine 1 operates in the same manner as when copying a document image, and the image of the slidefilm 103 is formed on the image receiving sheet.

When the motor M1 is activated, the CPU 81 fetches the state of the switch SW3 that detects the support base 203 reaching the upper limit position (n13). When the switch SW3 is activated with the support base 203 reaching the upper limit position, the motor M1 is turned off (n14), while the solenoid SOL2 for driving the shutter 107 is energized (n15). The solenoid SOL2 operates to pull the shutter 107 to open the opening 110 in the top panel of the box 105. Thereafter, the slidefilm 103 is removed from the slide holders 102 through the opening 110. Then, when the support base 203 is manually moved downward to the lower limit position to activate the switch SW4 that detects the support base 203 reaching the lower limit position (n16), the solenoid SOL2 is de-energized (n17), and the opening 110 of the box 105 is closed with the shutter 107. At the same time, the motor M2 for driving the mirror 8 in the optical system 13 of the copying machine 1 is driven in the reverse direction (n18), causing the mirror 8 to swing and rest in the position indicated by the solid line in FIG. 2. This completes the processing of the CPU 81, putting the copying machine 1 in a condition ready to copy a document image.

Although the above embodiment has described the copying machine which uses the photosensitive sheet coated on its surface with pressure-rupturable capsules enclosing photohardening materials and leuco dyes, it is apparent that the present invention is also applicable to a copying machine which uses a photosensitive drum having a photosensitive material thereon.

Also, the above embodiment has dealt with the forming of a copy image from the slidefilm, but it will be appreciated that the present invention is also applicable to the forming of a copy image from a light permeable liquid crystal panel, EL panel, etc.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A projection unit which is mounted in a copying machine and used to project an image of a light permeable original onto a prescribed exposure point on a photosensitive material, said projection unit comprising:
   a light source for exposure which is installed in a box;
   an original holding means which holds the original in a prescribed position with respect to said light source for exposure and said photosensitive material, and is disposed movably in said box so that the image of the original held in said original holding means is scanned in a prescribed direction with respect to the photosensitive material;
   a driving means for moving said original holding means in the scanning direction;
   a transmission means which is provided between said original holding means and said driving means, and is capable of moving between an engaged position in that said transmission means is coupled to said original holding means and said driving means so as to transmit power of said driving means to said holding means and a disengaged position in that said transmission means is not coupled to said original holding means and said driving means; and
   a switching means for putting said transmission means in the engaged position or disengaged position.

2. A projection unit according to claim 1, wherein said original holding means is provided with a operation member stretching from the inside of said box and is moved by manual operation of said operation member.

3. A projection unit according to claim 2, wherein said original holding means is provided with a manual operation detecting means which detects said operation member being operated, and said switching means is controlled on the basis of the result detected by said manual operation detecting means.

4. A projection unit according to claim 1, wherein said box is provided with an opening through which the original is inserted.

5. A projection unit according to claim 4, wherein said original holding means is moved to an original mounting position near to said opening so that the original inserted through said opening is mounted on said original holding means.

6. A projection unit according to claim 5, wherein said opening is opened and closed by means of a shutter.

7. A projection unit according to claim 6, wherein an original mounting position detecting means is provided in the moving range of said original holding means for detecting if said original holding means reaches said original mounting position, and said shutter opens or closes said opening on the basis of the result detected by said original mounting position detecting means.

8. A projection unit according to claim 5, wherein said original holding means is provided with an original mounting state detecting means which detects if the original is correctly mounted on said original holding means, and a prescribed announcing means is operated when said original mounting state detecting means detects that the original is not correctly mounted in said original holding means.

9. A projection unit according to claim 1, wherein said original comprises a film and a mount which sandwiches the periphery of said film in the direction of the thickness thereof.

10. A projection unit according to claim 9, wherein said original holding means comprises a pair of slide holders which sandwich said mount of said slidefilm orthogonal to the direction of the thickness of said mount, each of said slide holders being urged in the direction closer to each other.

11. A projection unit according to claim 10, wherein said slide holders are provided with V-shaped grooves at their inside ends facing each other, in which the prescribed sides of said mount of said slidefilm are fitted, respectively.

* * * * *